(12) United States Patent
Switzer et al.

(10) Patent No.: US 6,839,489 B2
(45) Date of Patent: Jan. 4, 2005

(54) MICRO-ELECTRODES FOR ELECTRO-OPTIC CONTROL OF OPTICAL WAVEGUIDES

(75) Inventors: Greggory Switzer, Bozeman, MT (US); Rand Swanson, Bozeman, MT (US); Philip Battle, Bozeman, MT (US)

(73) Assignee: AdvR, Inc., Bozeman, MT (US)

( * ) Notice: Subject to any disclaimer, the term of this patent is extended or adjusted under 35 U.S.C. 154(b) by 136 days.

(21) Appl. No.: 10/388,314

(22) Filed: Mar. 11, 2003

(65) Prior Publication Data

US 2004/0179783 A1 Sep. 16, 2004

(51) Int. Cl.⁷ .................................................. G02B 6/26
(52) U.S. Cl. .................................. 385/40; 385/2; 385/8
(58) Field of Search ............................. 385/2, 3, 8, 14, 385/40, 132

(56) References Cited

U.S. PATENT DOCUMENTS

| | | | |
|---|---|---|---|
| 4,917,451 A | | 4/1990 | Chouinard et al. ..... 385/141 X |
| 5,838,869 A | * | 11/1998 | Rasch et al. ................ 385/132 |
| 5,879,590 A | | 3/1999 | Blom et al. ............. 385/141 X |
| 6,404,537 B1 | * | 6/2002 | Melman et al. ............. 385/8 X |

OTHER PUBLICATIONS

Kintaka et al. "Fabrication of ferroelectric–domain–inverted gratings in LiNbO₃ by applying voltage using etched–Si stamper electrode", Electronic Letters, vol. 34, No. 9, Apr. 30, 1998, pp 880–881.

Sato et al., "Contact electrode method for fabricating bulk periodically poled LiNbO₃", Electronic Letters, vol. 34, No. 7, pp 660–661.

* cited by examiner

Primary Examiner—Phan T. H. Palmer
(74) Attorney, Agent, or Firm—Altera Law Group, LLC

(57) ABSTRACT

A method of attaching electrodes to optical substrates with embedded waveguides includes applying the electrode pattern to a separate superstrate from the electro-optic material containing the waveguide. This allows for the change of the index of refraction and/or the dipole moment of an electro-optic material using low voltages. In0 addition, the electrode superstrate can be detached from the waveguide substrate and repositioned and aligned to different waveguides. Removable electrodes add flexibility and increase yield by allowing the electrodes to be re-aligned to the waveguides when improper alignment occurs.

29 Claims, 8 Drawing Sheets

MICRO-ELECTRODES FOR ELECTRO-OPTIC CONTROL OF OPTICAL WAVEGUIDES

GOVERNMENT LICENSE RIGHTS

The U.S. government has a paid-up license in this invention and the right in limited circumstances to require the patent owner to license others on reasonable terms as provided for by the terms of Contract No. F29601-01-C-0016, awarded by the U.S. Air Force.

FIELD OF THE INVENTION

The present invention is directed generally to electro-optics and is believed to be particularly useful in interfacing micro-electrodes mounted on a non-conductive superstrate to electro-optic substrate materials with embedded waveguides.

BACKGROUND OF THE INVENTION

Optical waveguides embedded in materials such as silicon, lithium niobate, and potassium titanyl phosphate (KTP) have found many important applications such as wavelength division multiplexing and demultiplexing, phase modulation and laser stabilization. Other applications are related to phase control of channel waveguides, wavelength tuning with a Bragg waveguide, and low voltage poling of an electro-optic material. Many of these applications require an electric field to pass through the waveguide. The electric field may be generated by pairs of electrodes attached to one or more surfaces of the waveguide substrate. The electric field generated by the electrodes may be used for one of two purposes, either to change the index of refraction of the waveguide material or to change the dipole moment of the waveguide material.

A change in the index of refraction of the waveguide material may be used to control the characteristics of the radiation as it propagates through the waveguide. Some of these characteristics are its phase, center wavelength reflected by a Bragg grating, beam steering, and spatial mode profile. A change in the dipole moment of the waveguide material may be used to create quasi-phase-matched waveguides, which in turn may be used for second harmonic generation and various other forms of nonlinear frequency conversion.

There are two common approaches to apply this electric field through the waveguide, both approaches having the electrodes mounted on the same substrate which houses the waveguide. The first approach has the electrodes on opposite surfaces of the substrate with the waveguide sandwiched between the electrodes. The second approach has the electrodes on the same surface of the substrate, the electrodes straddling the waveguide. Both approaches typically require photo-lithographic procedures applied directly to the substrate material which houses the waveguide. Also, in this configuration it is typical to deposit the electrodes on the substrate after the waveguide region has been defined by diffusion, ion exchange, or other acceptable processing steps. In the event that problems arise during the electrode deposition steps, the entire substrate may be rendered useless. For example, the electrode mask pattern may be improperly aligned to the substrate geometry yielding unacceptable results. Also, in some cases there may be a high density of multiple components on the same substrate material. Given this the loss of an entire substrate may represent significant financial loss.

SUMMARY OF INVENTION

In view of the situation described above there is a need for an improved method to mount or attach electrodes to optical substrates with embedded waveguides. The present invention allows for the change of the index of refraction and/or the dipole moment of an electro-optic material using low voltages by applying the electrode pattern to a separate superstrate. This separate superstrate can be aligned and fixed over a particular waveguide housed by the substrate. In addition, the electrode superstrate can be detached from the waveguide substrate and repositioned and aligned to different waveguides. Removable electrodes add flexibility and reduce loss by allowing the electrodes to be re-aligned to the waveguides when improper alignment occurs.

One particular embodiment of the invention is directed to an electro-optic device that comprises a first optical waveguide in an electro-optic crystal, the electro-optic crystal having a first surface. An electrode plate has an electrode pattern on a second surface, the electrode pattern forming an electric field profile when a voltage is applied to the electrode pattern. The second surface of the electrode plate is removably disposed proximate the first surface of the electro-optic crystal so that the electric field profile passes through the first optical waveguide when the voltage is applied to the electrode pattern.

Another embodiment of the invention is directed to an electro-optic device that comprises crystal waveguiding means for guiding light within an electro-optic crystal. Electric field forming means forms an electric field in the crystal waveguiding means so as to control an electro-optic action of the crystal waveguiding means on light propagating along the crystal waveguiding means. The electric field forming means is disposed on a plate separate from the crystal waveguiding means. The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
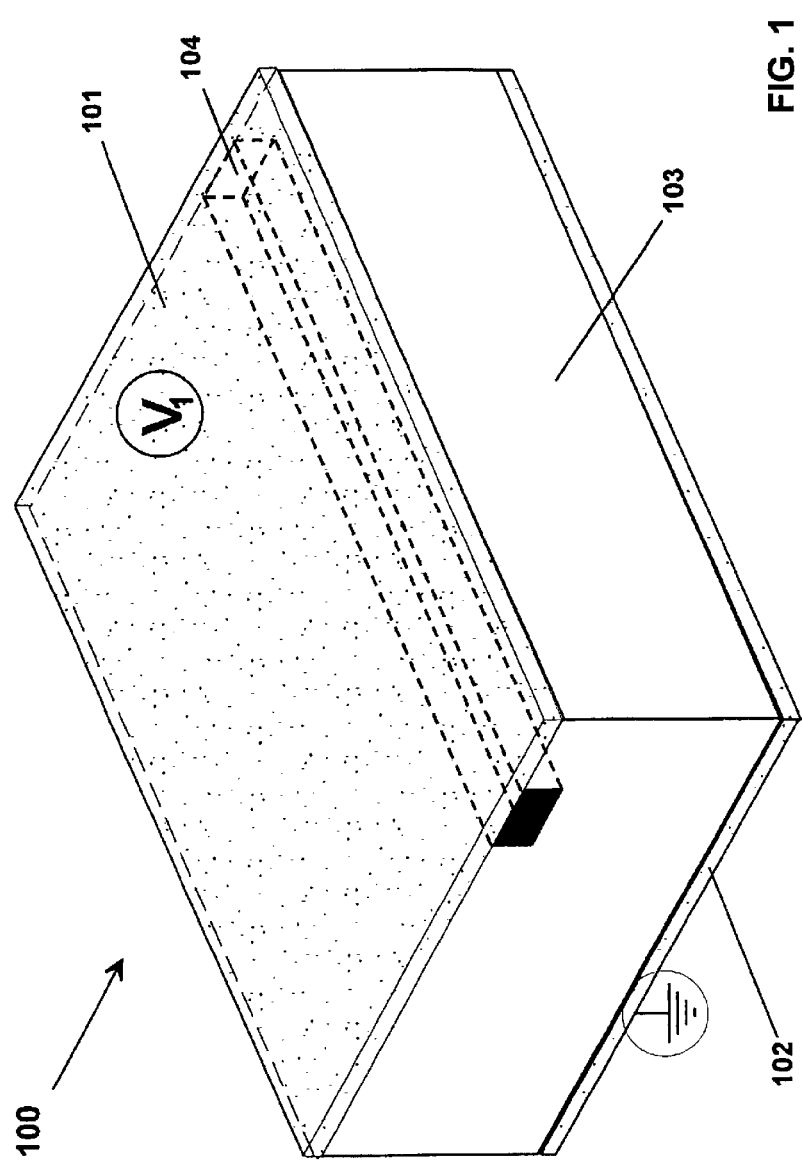
FIG. 1 shows an electro-optic device with a positive electrode and a ground electrode on opposite sides of a KTP substrate with an embedded waveguide.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to electro-optic materials and is believed to be particularly useful in interfacing micro-electrodes mounted on a non-conductive superstrate to electro-optic substrate materials with embedded waveguides.

Generally, the present invention relates to changing the index of refraction and/or the dipole moment of an electro-optic substrate material with an embedded waveguide by introducing an electric field across or through the waveguide region. Historically, there have been at least two common approaches to apply an electric field across or through the embedded waveguide.

The first approach is depicted schematically in FIG. 1, which shows an electro-optic device 100 with a positive electrode 101 and a ground electrode 102 on opposing sides of a KTP substrate 103. The electric field created by the voltage applied across the electrodes 101 and 102 passes through a waveguide 104 embedded in the KTP substrate 103. The strength of the induced electric field is inversely related to the spacing between the electrodes. A typical thickness of the KTP substrate 103 may be approximately 1 millimeter (mm), which may be large enough to require a high voltage across electrodes 101 and 102 to induce a discernable change in index of refraction in the waveguide region 104.

Figure 2:
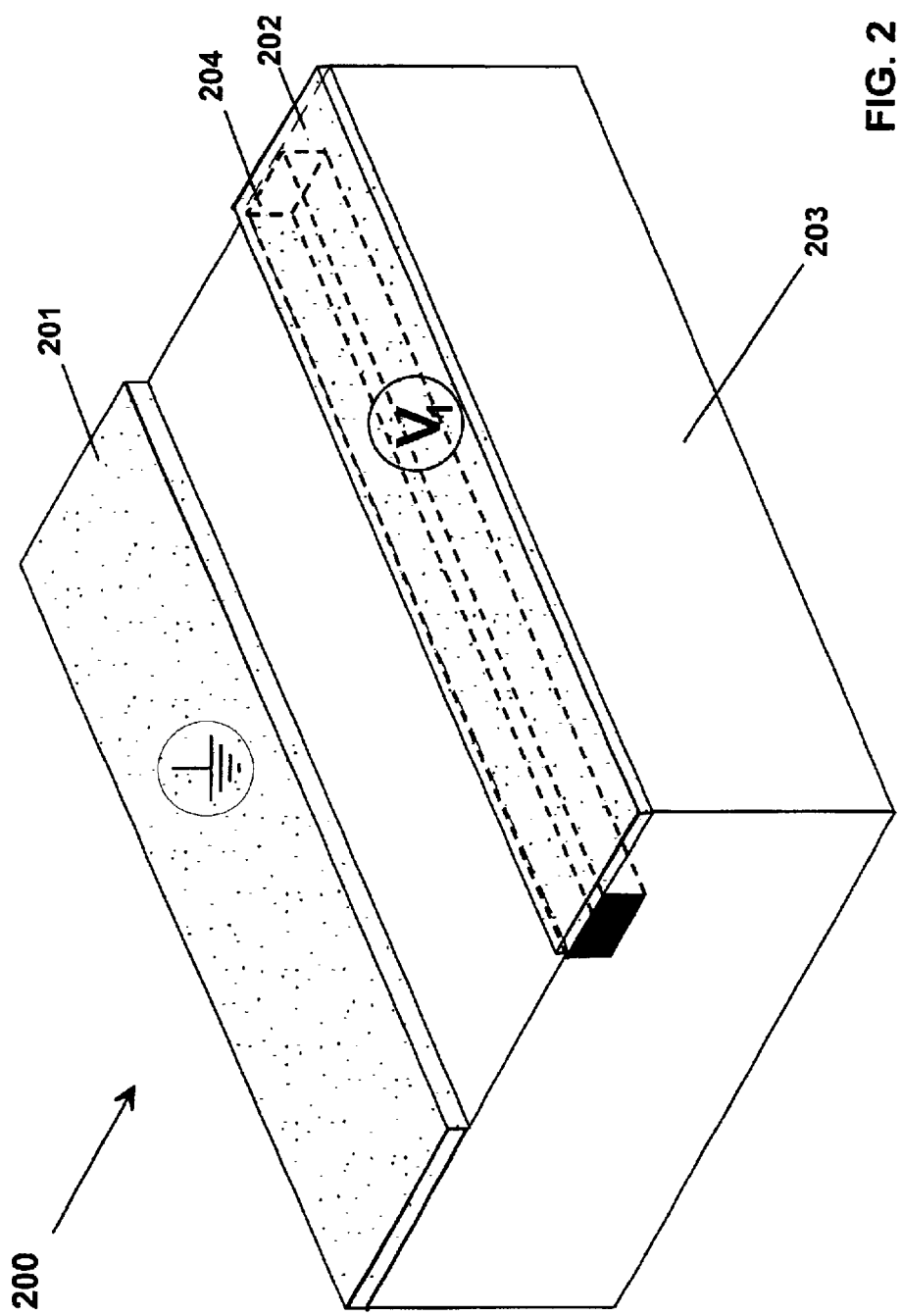
FIG. 2 shows an electro-optic device with a positive electrode and a ground electrode on the same side of a KTP substrate with an embedded waveguide.

A second historical approach is depicted schematically in FIG. 2, which shows an electro-optic device 200 with a positive electrode 201 and ground electrode 202 on the same side of a KTP substrate 203. Typically, photolithographic techniques are required to deposit the coplanar electrodes 201 and 202 directly onto the surface of the substrate 203 in the optimum position relative to the location of the waveguide 204. Tight alignment tolerances and small substrate size may make this a difficult and complex operation.

The most efficient way to direct the electric field across an individual waveguide may be to place both the positive and ground electrode on the same surface rather than on the opposite sides of the substrate. In this configuration the electrodes may be positioned arbitrarily close to each other, which may allow for the achievement of strong electric fields with relatively low voltages. The direction of the electric field inside the waveguide 204 depends on the position of the waveguide relative to the electrodes 201, 202. For instance, if the waveguide 204 is positioned at the edge of either electrode as shown in FIG. 2 for a z-cut material, a large component of the electric field lies along the vertical direction. Other substrate orientations, for example x- or y-cut materials, may require the waveguide to be positioned directly between the electrodes to take advantage of a horizontal electric field.

According to one embodiment of the present invention, an electrode pattern may be designed on computer-aided design (CAD) software and duplicated onto a laser cut, one-to-one optical mask following standard procedures. The mask may then be used to transfer the pattern onto separate substrate or superstrate materials using standard contact lithography. In one embodiment of the present invention the mask may be used to pattern subsequent electrode geometry onto an 0.8 mm thick glass superstrate using contact lithography. From the pattern, electrodes may be made, typically, by applying a 0.05 $\mu$m thick chrome layer followed by a 0.5 $\mu$m gold layer. The gold may aid in wire bonding, a welding technique for attaching an electrical lead to the superstrate.

Figure 3:
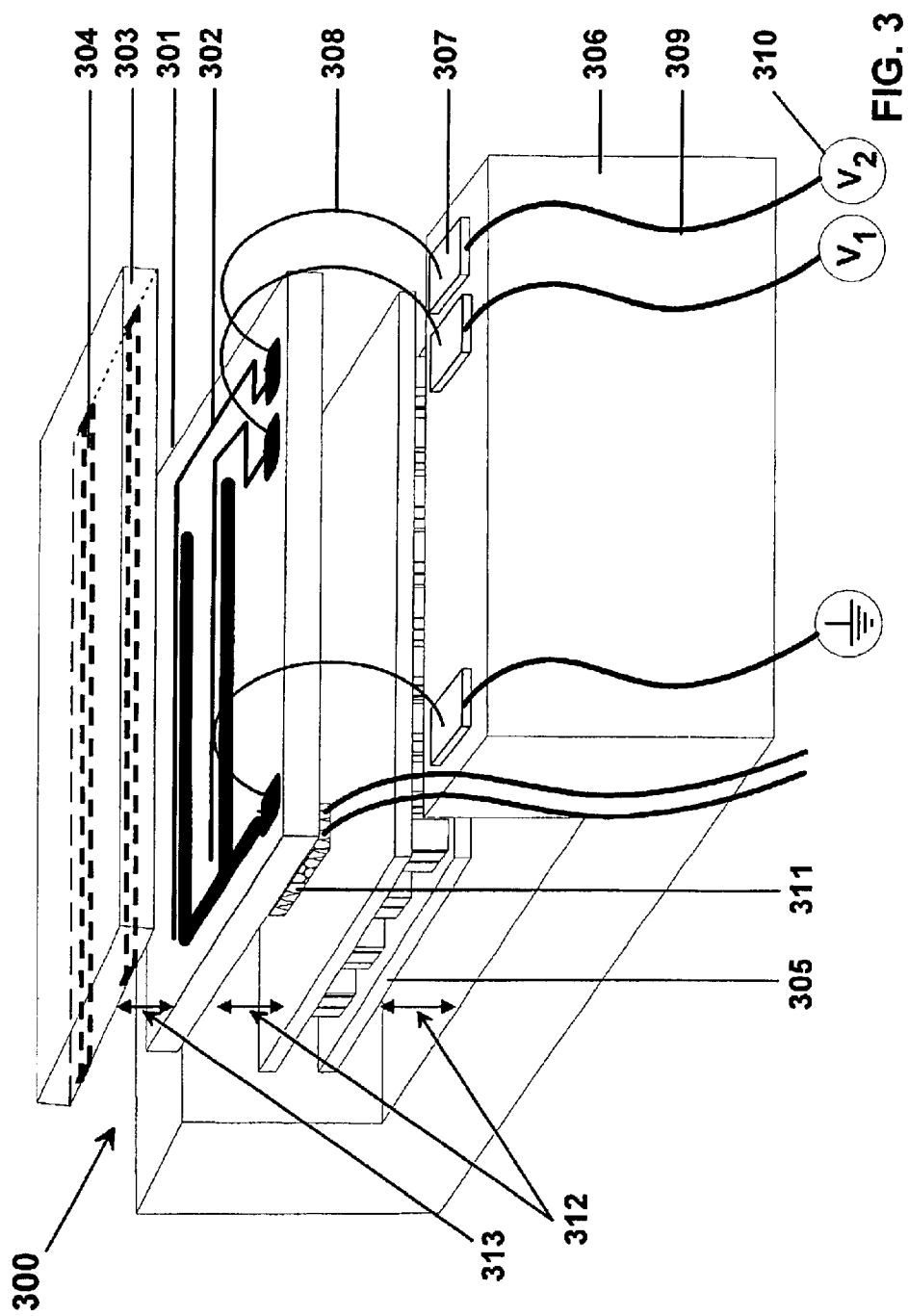
FIG. 3 shows an embodiment of electro-optic device which depicts an oblique view of a glass superstrate with electrodes, the superstrate shown positioned under a KTP chip containing waveguides, according to principles of the present invention.

One particular embodiment of an electro-optic device 300 according to the present invention is depicted schematically in FIG. 3, which depicts an oblique view of a glass superstrate 301 with electrodes 302. The superstrate 301 shown positioned under a KTP chip 303 containing waveguides 304. Typical dimensions for superstrate 301 may be 0.8 mm (thick)×10 mm (wide)×11 mm (long). The superstrate 301 may be attached to a thermoelectric cooler 305, which in turn may be attached to an aluminum plate 306, both by means of a thermally conductive epoxy 312. A thermistor 311 may be attached to the superstrate 301 to monitor the temperature of the waveguide region 304. The electrodes 302 may be attached to bond pads 307 using gold wire bonds 308. The bond pads 307 may be soldered to standard wire 309 and connected to a voltage supply 310.

Figure 4:
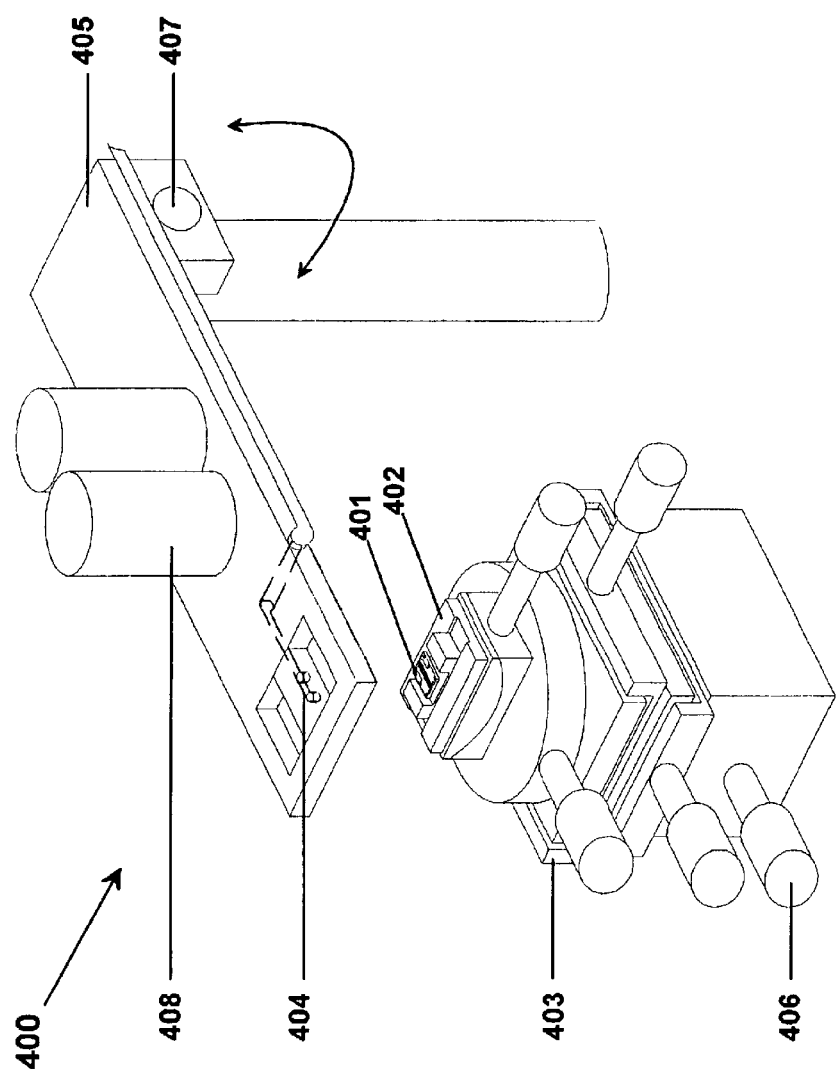
FIG. 4 shows an embodiment of an alignment device to mount the KTP chip to the superstrate, according to principles of the present invention.

One particular embodiment of an alignment device 400 is depicted schematically in FIG. 4. The alignment device 400 may be utilized to assemble the optical components in substantially the same vertical configuration as shown in FIG. 3, although other configurations may also perform in substantially the same manner. The superstrate 301 oriented with the electrodes 302 facing up and with attached thermoelectric cooler 305 and aluminum base 306 may be held in a clamp 402, all supported by a 5 degree-of-freedom (x, y, z, θ and φ) positioning stage 403. The KTP chip 303 may be suspended directly above the electrodes 302 by a vacuum chuck 404 mounted to an aluminum pivot arm 405. The KTP chip 303 may be inverted so that the surface containing the waveguides 304 is down, facing the electrodes 302 on the glass superstrate 401. The vacuum chuck 404 holding the KTP chip 303 may be machined of transparent material such as polycarbonate so that the alignment of the waveguides 304 to the electrodes 302 may be viewed through the vacuum chuck 404 from above using a far field microscope. The positioning stage 403 may be used to translate, rotate and side-to-side tilt the electrodes 302 on the glass superstrate 401 underneath the KTP waveguides 304 until the waveguides 304 are aligned with the electrodes 302. Front and rear tilt may be adjusted by vertically raising the superstrate 401 using the z-axis knob 406 of the positioning stage 403. One may also change the angle of the aluminum arm 405 supporting the vacuum chuck 404 relative to the KTP chip 303 by pivoting about the bearing 407 located at the rear of the pivot arm 405. A stop at the back of the pivot arm 405 may hold the arm horizontal until during initial alignment and may be later released during the final stage of alignment. Therefore, the KTP chip 303 may be rocked front-to-back until it is level and flat with respect to the glass superstrate 401. In addition, the pivot arm 405 may include weights 408 to compress a thin layer of UV cure epoxy 313 that may be placed between the electrodes 302 and the KTP chip surface 303.

The KTP waveguides 304 may be aligned and fixed over the electrodes 302 on the glass superstrate 401 using the following process. Approximately 1 milligram of Norland NOA61 UV cure epoxy or equivalent 313 may be placed over the electrodes 302 on the glass superstrate 401. The superstrate 401 may be heated to and maintained at approximately 60° C. using the thermo-electric cooler 305, thermistor 311 and temperature control circuit to reduce the viscosity of the epoxy 313, and in conjunction with applied pressure may reduce the spacing between the waveguides 304 and the electrodes 302. The glass superstrate 401 may then be raised using the z-axis knob 406 of the positioning stage 403 until the KTP chip 303 comes into contact with the epoxy 313 leaving a small distance between the waveguides 304 and the glass superstrate 401. The superstrate 401 may be intentionally made slightly shorter than the length of the KTP chip 303 to keep epoxy 313 from blocking the front and back facets of the waveguides 304.

Figure 5:
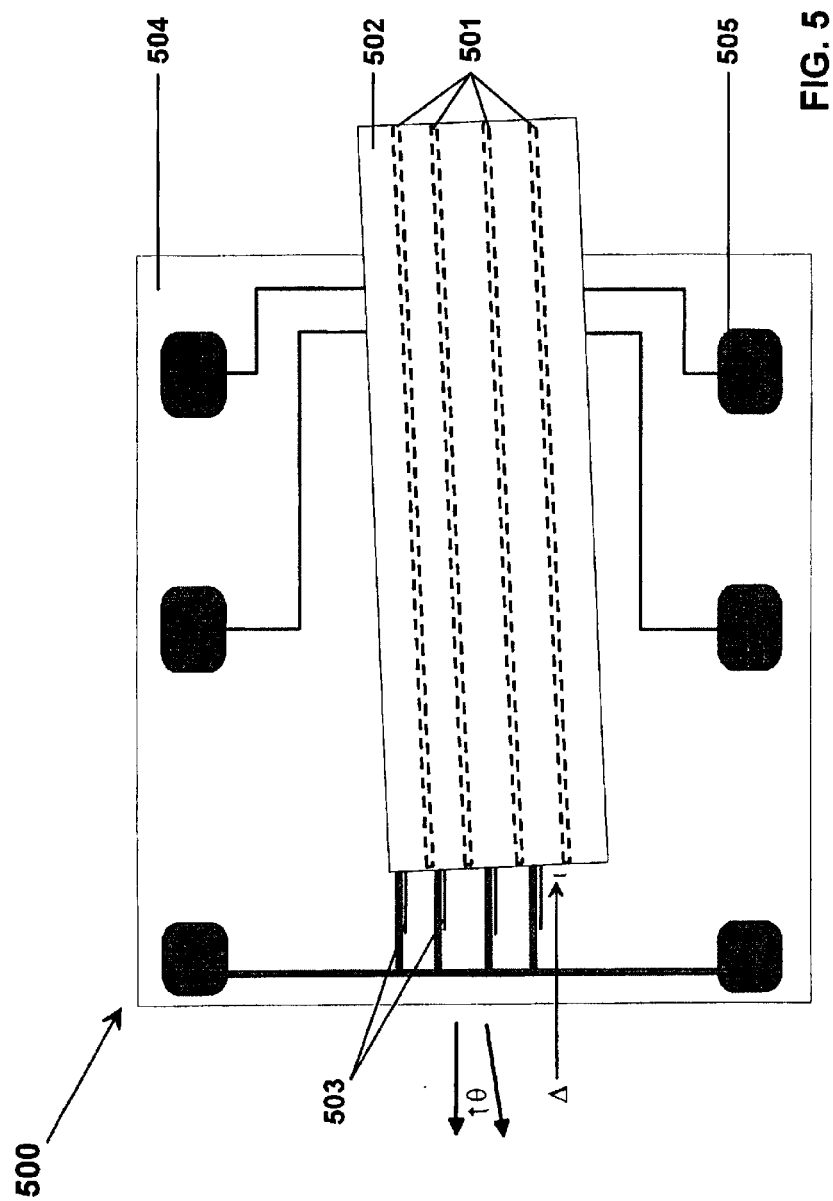
FIG. 5 shows a top view of a method for aligning the KTP chip to the superstrate, according to principles of the present invention.

FIG. 5 schematically depicts a magnified top view 500 of the KTP chip 502 to the superstrate 504 in the same vertical orientation as depicted in FIG. 3 while aligning the waveguides 501 in the KTP chip 502 to the electrodes 503 in the superstrate 504. The bond pads 505 on the surface of the superstrate 504 may be used for making external connections to the electrodes 503. The magnified view may be obtained with a medium power microscope, typically at 60× magnification, viewing the waveguides 501 through the KTP chip 502 and transparent vacuum chuck 404. Dynamic alignment of the superstrate 504 to the KTP chip 502 may be accomplished by raising the superstrate 504 via the Z axis knob 406 of the 5 degree-of-freedom stage 403 until the weights 408 compress the epoxy 313 between the KTP chip 502 and the superstrate 504.

Once compressed, it may be possible to view interference fringesformed between the KTP chip 502 and the transparent vacuum chuck 404 when illuminated with white light. Typical dimensions for the KTP chip 502 are 3 mm (width) by 10 mm (in length). There are typically four to five white light fringes are measured over the length of the KTP chip 502. If the superstrate 504 is parallel to the KTP chip 502, then the superstrate 504 applies even pressure to the KTP chip 502 when the two are brought into contact, and so the white light fringes remain largely unaffected. If, on the other hand, the superstrate 504 is not parallel to the KTP chip 502, then the superstrate 504 applies a greater pressure to one end of the KTP chip 502 when the two are brought into contact, which may be detected by a change in the separation of the white light fringes. Typically, the fringes concentrate at that end of the chip 502 where the pressure being applied by the superstrate 504 is greatest.

Also, by utilizing the alignment capabilities of the 5 degree-of-freedom stage 403, it may be possible under 60× magnification to align the electrodes 503 to less than a 2 micron offset $\Delta$ from the waveguides 501. If the maximum displacement between the waveguides 501 and electrodes 503, at at one end of the chip 502, is less than 2 microns, this translates into an angular misalignment $\theta$ of less than 1 milliradian in those cases where the length of the KTP chip 502 is approximately 10 millimeters.

Figure 6:
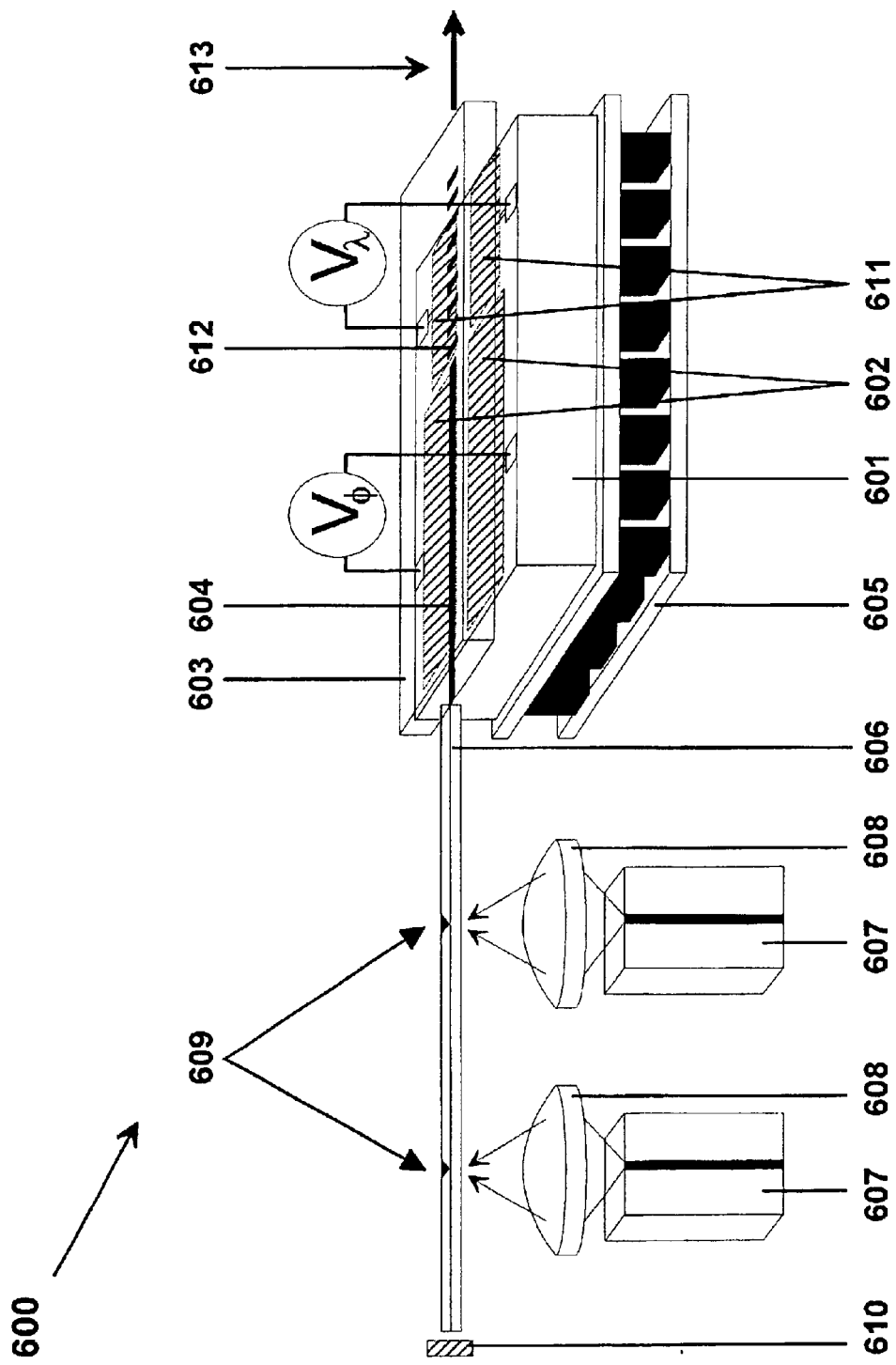
FIG. 6 shows a low-power injection seed laser unit with an adjustable linewidth to reduce Stimulated Brillouin Scattering (SBS) in fiber amplifiers and lasers, according to principles of the present invention.

One particular embodiment of an electro-optic device according to the present invention is depicted schematically in FIG. 6, which shows a low-power injection seed laser unit 600 with an adjustable linewidth that may be useful for reducing Stimulated Brillouin Scattering (SBS) in fiber amplifiers and lasers. SBS is a nonlinear effect that may limit the available output power of single or multi-mode fiber amplifiers and lasers by setting up a reflection in the fiber core thereby clamping the forward output power. A seed laser 600 with adjustable linewidth may be useful for broadening the spectral output sufficiently to reduce or eliminate this reflection, yet maintain sufficient coherence length to allow for coherent addition of multiple fiber amplifiers. The fiber lasers and amplifiers may be based on fibers doped with rare earth species, for example ytterbium (Yb) or erbium (Er).

The particular embodiment of seed laser 600 may employ optical waveguides 604 and 612 embedded in the KTP chip 603 for optical feedback to a short section of optically pumped, double clad, Yb-doped fiber 606 as the gain element. This may ensure the wavelength of the seed laser 600 will lie within the gain bandwidth of Yb-doped fiber amplifiers, typically from 1040 to 1120 nm. The optical fiber can be side-pumped by high power 976 nanometer (nm) diode lasers 607, the output of which may be coupled by lens 608 into the inner cladding and crossing the core of the fiber by reflecting off V-grooves 609 etched into the fiber or end-pumped directly into the inner cladding and core using emission from the 976 nm diode lasers 607.

One end of the doped fiber 606 may receive a highly reflective coating acting as an end mirror 610. The opposite end of the fiber 606 may be directly coupled to a channel waveguide 604 embedded in KTP chip 603. The channel waveguide 604 couples to a Bragg section 612 of the waveguide that may provide a wavelength selective reflection back to the doped fiber 606 and acts as a partially reflective end mirror for the laser output 613.

The KTP waveguide 604 may be aligned over the superstrate 601 containing the micro-electrodes 602 and 611 using techniques described earlier. The temperature of the KTP 603/superstrate 601 device may be controlled using a thermoelectric cooler 605 for added stability. The variation of a voltage $V_\lambda$ applied to the electrodes 611 across the Bragg section 612 of the waveguide may be used to tune the wavelength of the laser output 613. A voltage $V_\phi$ applied to the electrodes 602 across the channel waveguide section 604 may tune the phase of light 613. Continuous tuning may be achieved by simultaneously changing the voltage to the phase electrodes 602 and the Bragg electrodes 611. This dual adjustment may allow for a single longitudinal mode to be resonant within the external cavity defined by the reflective end of the fiber 610 and the Bragg section of the waveguide 612. Also, continuous tuning of the voltage $V_\lambda$ may permit the frequency of the laser 600 to be matched, or closely matched to the frequency of the laser or amplifier device being injection seeded by this laser 600.

Average linewidth control may be achieved by applying a rapid, oscillating voltage to the channel electrodes 602 and the Bragg electrodes 611 together in tandem, or independently. The electric field applied across the KTP Bragg waveguide 612 section typically affects the laser output 613 by the following process. The period of the Bragg section 612 determines the wavelength $\lambda_B$ of the light reflected back to the Yb-doped amplified fiber 606 or a laser diode according to equation 1 below:

$$\lambda_B = \frac{2n\Lambda}{m} \quad (1)$$

where n is the index of refraction in the Bragg waveguide region 612, $\Lambda$ is the period of the Bragg grating elements, and m is the order of the Bragg reflection. The effective optical path length of the Bragg period $n\Lambda$ may be changed either by a combination of thermal induced change in index of refraction n and thermal expansion or contraction of the KTP chip 603, or by applying an electric field to change the index of refraction n. Both effects operating alone or in tandem may be used to tune the reflected wavelength $\lambda_B$. The index of refraction of KTP may be changed very rapidly by applying an external electric field. An optical field with extraordinary polarization (parallel to the z axis of the crystal) propagating through the Bragg section 612 will experience a change in the index of refraction, $\delta_n(E)$, given by equation 2 below:

$$\delta n(E) = \frac{1}{2} n^3 r_{33} E \quad (2)$$

where E is the magnitude of the external field applied parallel to the z axis, and $r_{33}$ is the electro-optic coefficient appropriate for the KTP substrate. Replacing $\lambda_B$ with $\lambda_B + \delta\lambda_B$ and n with $n+\delta n$ in equation 1, and using equation 2, an expression for the change in the Bragg wavelength, $\delta\lambda_B$ can be derived $$\delta\lambda_B = \frac{\Lambda}{m} n^3 r_{33} E \quad (3)$$

Equation 3 suggests that electro-optic control of a Bragg grating 612 embedded in a KTP chip 603 may be possible. In addition, the channel section of the waveguide 604 may be electro-optically tuned to adjust the optical path length within the external cavity formed between the Bragg grating 612 and the end mirror 610. This may be used to keep the same longitudinal mode of the cavity resonant as the Bragg section 612 selects the wavelength. Simultaneous control of both the phase and wavelength of the light in the resonator cavity may provide continuous wavelength tuning of the laser output 613.

Other advantages this seed laser unit 600 may have over current technologies include: only one laser may be needed to achieve a narrow or broad linewidth emission, the seed laser unit 600 may be factory set to a specific wavelength between 1040 nm and 1120 nm using a single KTP chip 603 which may host multiple waveguides with channel 604 and Bragg 612 sections, each designed to reflect a certain wavelength. The center wavelength may be temperature tuned to ±1 nm to hit target wavelengths. The electro-optic wavelength control may be scanned at gigahertz-type rates, and a simple compact design may be realized with a minimum of custom components, thereby reducing manufacturing costs.

Figure 7:
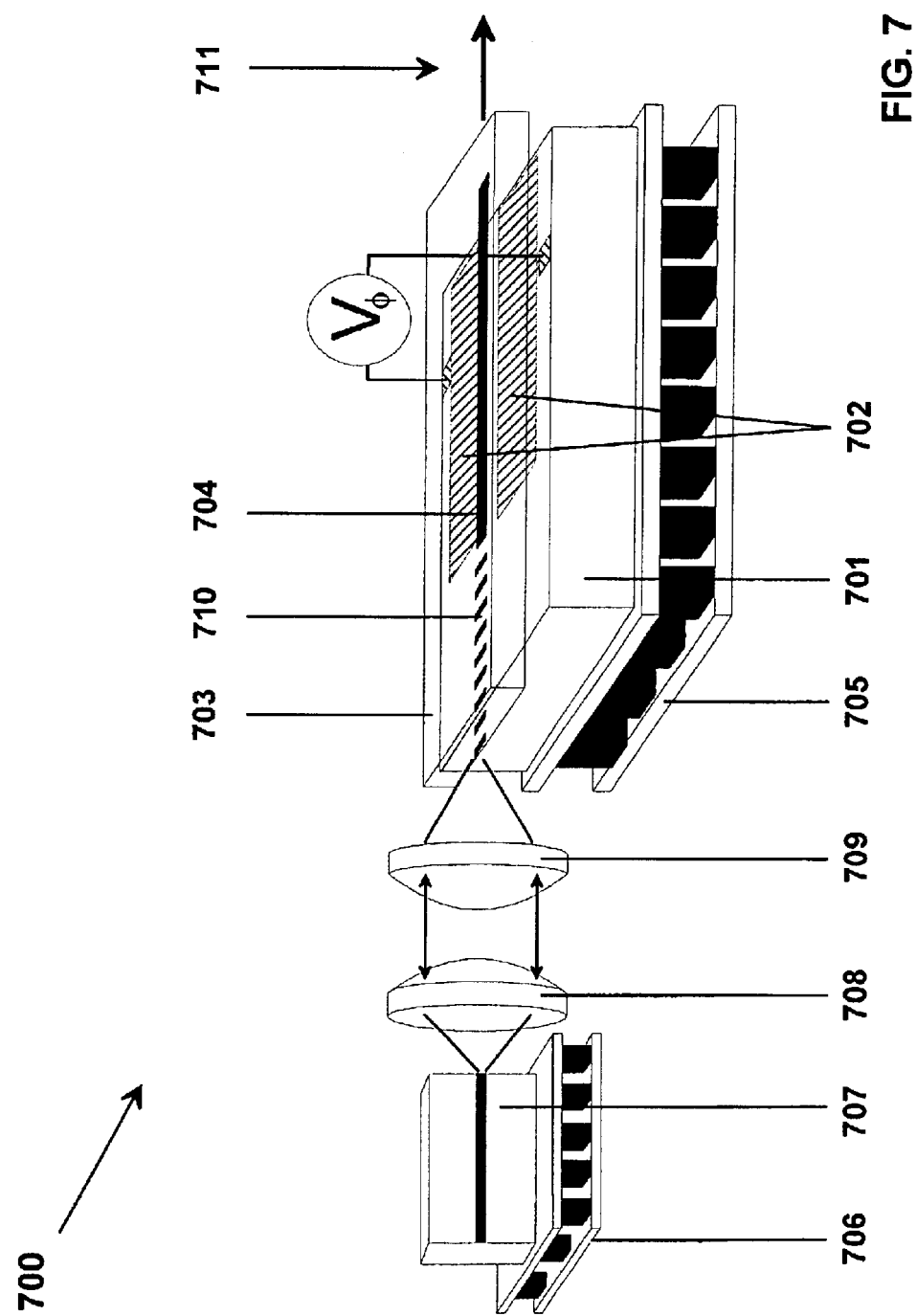
FIG. 7 shows an embodiment of an electro-optic device which may both stabilize a semiconductor laser and frequency modulate its output using removable microelectrodes, according to principles of the present invention.

FIG. 7 depicts a schematic representation of an electro-optic device 700 which may be used to both stabilize a laser and frequency modulate its output using removable microelectrodes. The electro-optic device 700 may comprise back-to-back dual-element waveguides 704 and 710 embedded in an electro-optic material 703 such as potassium titanyl phosphate (KTP). In one embodiment, the KTP substrate 703 containing the optical waveguides 704 and 710 may be aligned and fixed to an electrically insulating superstrate 701 containing microelectrodes 702 using the techniques described earlier. The KTP substrate 703 may rest on a thermo-electric cooler 705 in order to temperature control the Bragg waveguide region 710 to stabilize the reflected wavelength to the Fabry-Perot type diode laser 707, or other suitable laser source.

Emission from a standard Fabry-Perot type diode laser 707 may be coupled into the waveguide 710 by varying techniques including, but not limited to, a condensing lens, a series of positive focal length lenses, or direct end-face coupling the laser 707 to the waveguide 710. In one embodiment of the present invention, the emission from the Fabry-Perot type diode laser 707 may be collimated using a high numerical aperture (NA) lens 708 such as a Geltech Corporation part number C330TM (f=3.1 mm, 0.68 NA) then focused into the waveguide 710 using a condensing lens 709 such as a Geltech Corporation part number C110TM (f=6.24 mm, 0.25NA). A typical coupling efficiency of 30% to 40% from the lens 708 to the KTP chip 703 may be achieved using this configuration, which is sufficient to stabilize the output of the Fabry-Perot type diode laser 707 to a single frequency via an approximately 50% reflective Bragg grating 710. The light transmitted through the Bragg grating region 710 exits the channel waveguide 704 as the laser output 711.

The diode laser 707 may rest on a thermal electric cooler 706 in order to temperature control the laser 707 for added wavelength stability and extended lifetime. In this configuration, the electro-optically controlled section of the waveguide 704 lies outside the external cavity defined by the diode laser 707 and the Bragg section 710 of the waveguide. Applying an oscillating voltage $V_\phi$ across the microelectrodes 702 at a specific frequency f causes an oscillating variation in the index of refraction. This results in a change in phase of the wavelength-stabilized light that can generate side bands at plus and minus the modulation frequency about the main optical carrier frequency. This device may be useful for, but not limited to, ultra-sensitive detection of trace gases and atmospheric gases using frequency modulated (FM) spectroscopy.

Figure 8:
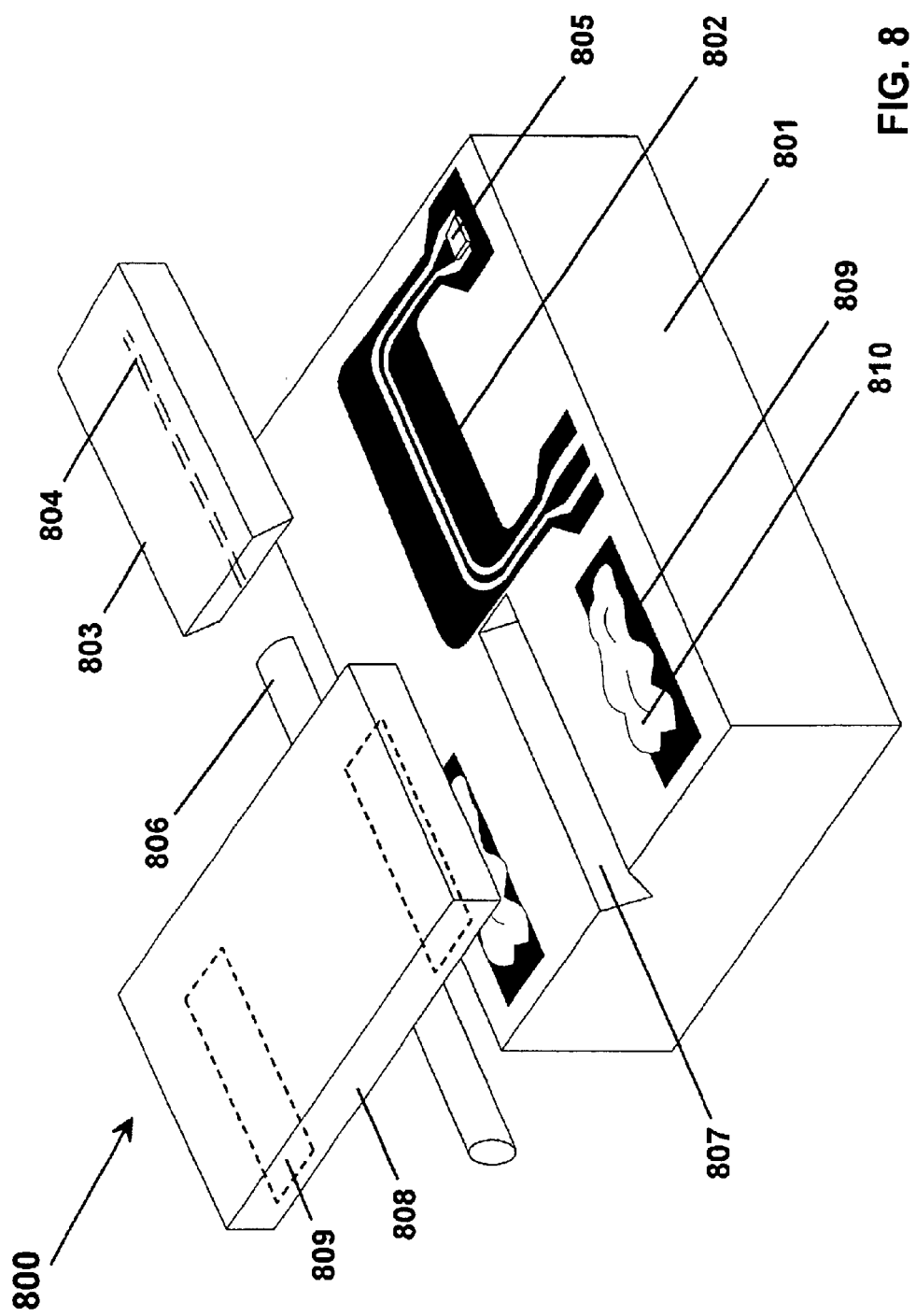
FIG. 8 shows a schematic representation of an embodiment of an electro-optic device with a superstrate structure designed with mechanical features and landmarks to aid in aligning optical fibers to embedded waveguides nested in separate substrates.

FIG. 8 depicts a schematic representation of an embodiment of an electro-optic device 800 with a superstrate structure 801 designed with mechanical features and landmarks to aid in aligning optical fibers to embedded waveguides nested in separate substrates 803. Microelectrodes 802, V-groove 807, and adhesion pads 809 may be simultaneously patterned onto the superstrate 801 using standard photolithography techniques. The electrode pattern 802 may include an impedance matching electronics unit 805 for fast modulation of an applied voltage potential.

Once the superstrate 801 is patterned, the electrodes 802 and adhesion pads 809 may be protected with a chemical resistant mask, so only an alignment feature, such as the V-groove 807, is chemically etched into the superstrate 801. The chemically resistant mask may have alignment features referenced to the superstrate 801 which may ensure the V-groove 807 is etched parallel to and terminates adjacent to electrodes 802. Once the masking material is removed, the KTP waveguide 804 may be aligned and affixed to the electrodes 802 utilizing the procedures and hardware outlined in FIG. 4. Due to the nature of photolithography, the patterned features may be precisely aligned relative to each other to sub-micron tolerances. This may enable a high coupling efficiency from the fiber 806 into the KTP waveguide 804.

The optical fiber 806 may then be inserted into the V-groove 807 and butted up to the KTP waveguide 804, thus completing the fiber 806 to waveguide 804 alignment. The fiber 806 may then be sandwiched between a lid 808 and the V-groove 807 for mechanical integrity. Adhesion pads 809 may be provided on both the top of the superstrate 801 and the bottom of the lid 808 in corresponding locations. The adhesion pads 809 may be coated with a thin layer of standard epoxy, or other suitable materials such as an ultraviolet (UV) curable or low temperature solder 810. Good coupling efficiency between the fiber 806 and the KTP waveguide 804 may be expected because the core dimensions and numerical aperture of both the fiber 806 and KTP waveguide 804 may be similar.

The superstrate 801 may be extended to support a second, passively aligned fiber at the opposite end of the KTP waveguide 804 resulting in a fiber pigtailed design. One advantage of having the electrodes 802 on the superstrate 801 separate from the KTP substrate 803 containing the optical waveguide 804, is that the substrate material 803 may not need to be exposed to the chemical etchant which may damage the waveguide 804. Additionally, alternative materials may be chosen for the superstrate 801 that preferentially etches well, such as silicon. This configuration may enable light to be coupled from the optical fiber 806 into the KTP waveguide 804 (or vice versa) and electro-optical control of the KTP waveguide 804 structure on a single, mechanically stable, integrated superstrate 801.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. For example, the electro-optic crystal need not be KTP, but may be another material. One example of another material is an isomorph of KTP. The claims are intended to cover such modifications and devices.

We claim:

1. An electro-optic device, comprising:
   a first optical waveguide in an electro-optic crystal, the electro-optic crystal having a first surface; and
   an electrode plate having an electrode pattern on a second surface, the electrode pattern forming an electric field profile when a voltage is applied to the electrode pattern, the second surface of the electrode plate being removably disposed proximate the first surface of the electro-optic crystal so that the electric field profile passes through the first optical waveguide when the voltage is applied to the electrode pattern.

2. A device as recited in claim 1, the first optical waveguide comprising including a Bragg reflector portion, and further comprising an active medium optically coupled to the Bragg reflector portion, the active medium being disposed within a laser cavity formed between the Bragg reflector portion and a second reflector.

3. A device as recited in claim 2, wherein the active medium is a doped optical fiber.

4. A device as recited in claim 3, further comprising at least one pump laser diode producing pump light, the pump light being coupled into the doped optical fiber.

5. A device as recited in claim 4, wherein the pump light is side-coupled into the doped optical fiber.

6. A device as recited in claim 5, wherein the doped optical fiber comprises an inner cladding and an outer cladding, the doped optical fiber further comprising a coupling groove disposed on a side of the doped optical fiber to direct pump light, substantially radially incident on the doped optical fiber, along the fiber within at least one of the inner and outer cladding.

7. A device as recited in claim 3, wherein the electrode plate comprises a locating groove, the doped optical fiber being positioned in the locating groove.

8. A device as recited in claim 2, wherein the first optical waveguide further comprises a modulator region.

9. A device as recited in claim 8, wherein the modulator region is disposed within the laser cavity.

10. A device as recited in claim 8, wherein the modulator region is disposed outside the laser cavity.

11. A device as recited in claim 2, wherein the active medium is a semiconductor laser element.

12. A device as recited in claim 11, further comprising a light coupling unit disposed between the semiconductor laser element and the first optical waveguide.

13. A device as recited in claim 1, wherein the electro-optic crystal and the electrode plate comprise an electroded crystal package, the electroded crystal package being thermally coupled to a temperature control unit for controlling the temperature of the electro-optic crystal.

14. A device as recited in claim 13, wherein the temperature control unit and the electroded crystal package are mounted in a mounting block.

15. A device as recited in claim 14, further comprising electrical leads electrically coupled to the electrode pattern for applying an electric field to the electro-optic crystal.

16. A device as recited in claim 15, further comprising bond pads on the mounting block, the electrical leads being attached to the bond pads, and fly leads coupling between the electrode pattern and the bond pads.

17. A device as recited in claim 1, wherein the first optical waveguide includes a modulator region.

18. A device as recited in claim 17, wherein the first optical waveguide includes a Bragg reflector region.

19. A device as recited in claim 1, wherein the electro-optic crystal is one of potassium titanyl phosphate and an isomorph of potassium titanyl phosphate.

20. A device as recited in claim 1, wherein the first optical waveguide comprises a Bragg reflector, application of the voltage to the electrode pattern resulting in tuning of a peak reflective wavelength of the Bragg reflector.

21. A device as recited in claim 1, wherein the electric field profile and crystal axes of the electro-optic crystal are relatively oriented so that the phase of light propagating along the first optical waveguide is modulated when the voltage applied to the electrode pattern is changed.

22. A device as recited in claim 1, wherein first optical waveguide comprises a phase modulator section and a Bragg reflector section.

23. A device as recited in claim 1, further comprising at least a second optical waveguide in the electro-optic crystal, wherein the electrode pattern includes electrode elements for forming an electric field in the first optical waveguide and in at least the second optical waveguide.

24. A device as recited in claim 1, further comprising an adhesive between the first surface of the electro-optic crystal and the second surface of the electrode plate to attach the electrode plate to the electro-optic crystal.

25. A device as recited in claim 1, wherein the electrode pattern is positioned relative to the first optical waveguide so that the electric field within the first optical waveguide lies substantially perpendicular to the first surface of the electro-optic crystal.

26. A device as recited in claim 1, wherein the electrode pattern is positioned relative to the first optical waveguide so that the electric field within the first optical waveguide lies substantially parallel to the first surface of the electro-optic crystal.

27. A device as recited in claim 1, wherein the first optical waveguide includes a Bragg reflector region.

28. A device as recited in claim 1, wherein the electrode plate includes a locating feature and further comprising an optical fiber having an end optically coupled to the first optical waveguide, a position of the optical fiber relative to the electrode pattern being determined at least in part by the locating feature on the electrode plate.

29. An electro-optic device, comprising:
   crystal waveguiding means for guiding light within an electro-optic crystal; and
   electric field forming means for forming an electric field in the crystal waveguiding means so as to control an electro-optic action of the crystal waveguiding means on light propagating along the crystal waveguiding means, the electric field forming means being disposed on a plate separate from the crystal waveguiding means.

* * * * *